United States Patent [19]

Uchida et al.

[11] Patent Number: 5,699,373
[45] Date of Patent: Dec. 16, 1997

[54] OSCILLATION POLARIZATION SELECTIVE SEMICONDUCTOR LASER AND OPTICAL COMMUNICATION SYSTEM USING THE SAME

[75] Inventors: Mamoru Uchida, Yokohama; Toshihiko Ouchi, Machida, both of Japan

[73] Assignee: Canon Kabushiki Kaisha, Tokyo, Japan

[21] Appl. No.: 769,319

[22] Filed: Dec. 19, 1996

Related U.S. Application Data

[63] Continuation of Ser. No. 404,751, Mar. 15, 1995, abandoned.

[30] Foreign Application Priority Data

Mar. 17, 1994 [JP] Japan .................................. 6-072481
Feb. 27, 1995 [JP] Japan .................................. 7-063356

[51] Int. Cl.$^6$ .............................. H01S 3/10; H01S 3/19
[52] U.S. Cl. .............................. 372/27; 372/45; 372/50; 372/96
[58] Field of Search .............................. 372/27, 45, 96, 372/50

[56] References Cited

U.S. PATENT DOCUMENTS

| 5,033,053 | 7/1991 | Shimizu et al. | 372/50 |
| 5,390,209 | 2/1995 | Vakhshoori | 372/27 |
| 5,438,584 | 8/1995 | Paoli et al. | 372/45 |

FOREIGN PATENT DOCUMENTS

| 0484923A3 | 5/1992 | European Pat. Off. . |
| 60-189981 | 9/1985 | Japan . |
| 62-042593 | 2/1987 | Japan . |
| 2144426 | 6/1987 | Japan . |
| 62-144426 | 6/1987 | Japan . |
| 02159781 | 6/1990 | Japan . |
| 2159781 | 6/1990 | Japan . |
| WO9214174 | 8/1991 | WIPO . |

OTHER PUBLICATIONS

"Polarization insensitive strained quantum well gain medium for lasers and optical amplifiers" by A. Mathur et al. Appl. Phys. ltr. 61.(24), Dec. 14, 1992, New York; pp. 2845–2847.

"Gain Saturation Properties of a Semiconductor Gain Medium with Tensile and Compressive Strain Quantum Wells" by S. Dubovitsky et al.; IEEE Journal of Quantum Electronics; vol. 30; No. 2; Feb. 1994; N.Y. pp. 380–391.

"1.55 µm Polarization–Insensitive High–Gain Tensile–Strained–Barrier MQW Optical Amplifier" by K. Magari et al. IEEE Photonics Technology Ltrs. vol. 3, No. 11, Nov. 1991; pp. 998–1000.

*Primary Examiner*—James W. Davie
*Attorney, Agent, or Firm*—Fitzpatrick, Cella, Harper & Scinto

[57] ABSTRACT

An oscillation polarization selective semiconductor laser that switches oscillation polarization modes between two different polarization modes includes a laser structure on a substrate. An active layer of the laser structure includes plural sets of quantum wells and barriers. The structure of at least one set of quantum wells and the barriers is different from the other sets so that the gain spectra generated in the active layer for induced mutually perpendicular propagation modes are selectively controlled by controlling the carrier density injected into the active layer. The oscillation polarization selective semiconductor laser may be used as a light source in optical communication systems.

24 Claims, 9 Drawing Sheets

FIRST REGION | SECOND REGION | THIRD REGION

OSCILLATION POLARIZATION SELECTIVE SEMICONDUCTOR LASER AND OPTICAL COMMUNICATION SYSTEM USING THE SAME this application is a continuation of application Ser. No. 08/404,751 filed Mar. 15, 1995, now abandoned.

BACKGROUND OF THE INVENTION

1. Field of the Invention

The present invention relates to an oscillation polarization selective semiconductor laser whose state of polarization of oscillated light can be switched and which is suitable for a light source used in optical communications, optical information processing, such as an optical memory, optical operations and optical computers, and so forth. The present invention further relates to an optical communication system using the oscillation polarization selective semiconductor as a light source in a transmitter.

2. Related Background Art

In recent years, increased transmission capacity in the field of optical communication has become desirable, and the use of a semiconductor laser or the like as a light source in a transmitter has satisfied such desire and solved a number of existing problems, to some extent. However, the phenomenon called chirping has not yet been satisfactorily solved. In chirping, the refractive index fluctuates due to an uneven distribution of carriers in a device when high-speed intensity modulation of the device is performed, and the oscillation waveform of oscillated signal light is distorted. In one of prime methods for solving the chirping at present, a semiconductor laser is continuously driven (CW driving) and the continuous light wave from the laser is intensity-modulated by an external modulator which uses a dielectric material, a semiconductor or the like. This method, however, has drawbacks in that there are limitations to down-sizing and cost reduction of the device and in that flexibility of optical networks (capability of simultaneous transmission of signals whose speeds are greatly different, etc.) is not high.

Furthermore, another system has been proposed, in which the polarization mode of oscillated light from a distributed feedback (DFB) laser is switched between light waves in TE (transverse electric) and TM (transverse magnetic) modes and only one of TE and TM modes is selected for transmission (see, for example, Japanese Patent Laid-Open Nos. 62(Showa)-42593, 62(Showa)-144426 and 2(Heisei)-159781). Such a polarization modulation method, as illustrated in FIG. 1, has characteristics that the oscillation polarization is changed from TM mode to TE mode at a given current point, and the threshold gain is selectively reached between TE mode and TM mode by a signal current with a constant current for simultaneous oscillation of TE and TM modes being injected as a bias point. The polarization-modulated light from the semiconductor laser is transmitted through a polarizer and only light polarized in a given direction is transmitted over a transmission line. However, no specific structure for such a laser is disclosed in either of those prior art references.

Furthermore, in the case of a prior art direct polarization modulation system, a difference between threshold gains of TE and TM modes is large, so a great change in carrier density is needed to perform the polarization switching in the device. As a result, the oscillation spectral line width is widened and hence such a laser could not yet be applied to a practical system.

SUMMARY OF THE INVENTION

It is an object of the present invention to provide an oscillation polarization selective semiconductor laser in which chirping is highly reduced and which can be readily fabricated and an optical communication system or network using the semiconductor laser.

The invention is directed to an oscillation polarization selective laser that switches an oscillation polarization mode between two different polarization modes. The semiconductor laser has a distributed reflector and an active layer that includes an asymmetric quantum well structure with plural sets of quantum wells and barriers. The structure of at least one of the sets is different than the structure of the other sets so that the gain spectra generated in the active layer for mutually perpendicular propagation modes is selectively controlled.

More particularly, a semiconductor laser of the present invention includes an active layer of an asymmetric quantum well structure so that gain profiles for different polarization modes (typically, TE and TM modes) are respectively controlled to perform direct oscillation polarization modulation or switching. Its concept is as follows:

1) An asymmetric quantum well structure, in which structures (e.g., layer thickness and composition or energy bandgap) of at least one set of a plurality of wells and a plurality of barriers are different from each other, is used in an active layer to reduce a difference between threshold gains for different polarization modes (TE and TM modes).

2) The threshold gain is switched between different polarization modes (TE and TM modes) by controlling an injection current to perform direct oscillation polarization modulation.

3) Layers other than an active layer can be of the same structure as layers of an ordinary semiconductor laser whose fabrication techniques are well established.

The asymmetric quantum well structure has a larger freedom of variation in its bandgap than an ordinary quantum well structure, and further a strain asymmetric quantum well structure has a still larger freedom of variation in its bandgap than the asymmetric quantum well structure. When strain is asymmetrically introduced into the asymmetric quantum well structure, bandgaps can be selectively or independently varied for different polarization modes (TE and TM modes). This means that gains generated in a common active layer by a common injection current density can be respectively set to threshold gains for different polarization modes (TE and TM modes). As a result, when the threshold carrier density or injection curent is set at a polarization modulation bias current point and a signal current is superimposed on the threshold injection current, the oscillation polarization of output light can be switched between two polarization modes. The amplitude of the signal current superimposed on the bias current is small, so that the density of carriers in a laser cavity or resonator scarcely fluctuates. Therefore, the intensity of total output light scarcely varies during the polarization switching operation. Thus, chirping is substantially reduced.

The object of the present invention is achieved by the following semicondcutor lasers and optical communication systems using this laser.

According to one aspect of the present invention, there is provided an oscillation polarization selective semiconductor laser for switching an oscillation polarization mode between two different polarization modes, which includes a substrate and a laser structure formed on the substrate which has an active layer with an asymmetric quantum well structure. The asymmetric quantum well structure includes a plurality of quantum wells and barriers, and structures of at least one set of the wells and the barriers are different from each other.

According to another aspect of the present invention, there is provided an oscillation polarization selective semiconductor laser for switching an oscillation polarization mode between two different polarization modes, which includes a distributed reflector and an active layer having an asymmetric quantum well structure. The asymmetric quantum well structure includes a plurality of quantum wells and barriers, and structures of at least one set of the wells and the barriers are different from other structures such that gain spectra generated in the active layer for mutually-perpendicular propagation modes induced in a layer structure of the laser is selectively controlled for each threshold oscillation gain by controlling the density of carriers injected into the active layer.

According to still another aspect of the present invention, there is provided an optical communication system for transmitting a signal from a transmitter side to a receiver side over a transmission line, which includes an oscillation polarization selective semiconductor laser for switching an oscillation polarization mode between two different polarization modes, as described immediately above, and a polarizer disposed in front of a light emission end surface of the semiconductor laser for selecting only a signal having a predetermined polarization mode.

According to yet another aspect of the present invention, there is provided an optical communication system for transmitting a signal from a transmitter side to a receiver side over a transmission line, which includes an oscillation polarization selective semiconductor laser for switching an oscillation polarization mode between two different polarization modes and simultaneously transmitting two kinds of signal light waves whose polarization modes are different from each other, as described above, and a receiver for receiving the two kinds of signal light waves simultaneously.

These advantages and others will be more readily understood in connection with the following detailed description of the preferred embodiments in conjunction with the drawings.

DESCRIPTION OF THE PREFERRED EMBODIMENTS

First Embodiment

A first embodiment of the present invention will be described with reference to FIGS. 2 and 3. The first embodiment is directed to an oscillation polarization selective semiconductor laser having a single electrode and an asymmetric quantum well (QW) structure which includes different well layers and/or different barrier layers.

Figure 3:
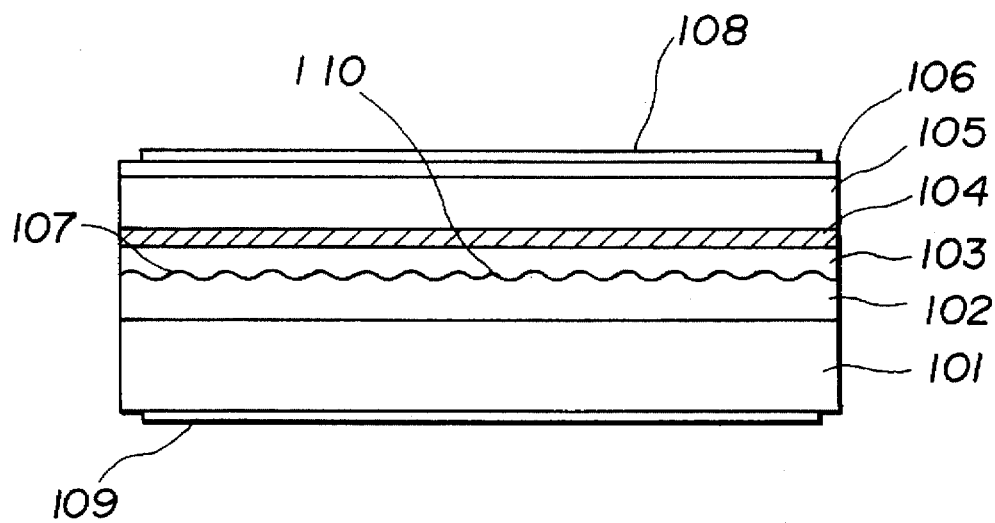
FIG. 3 is a longitudinal cross-sectional view showing the structure of the first embodiment.

As shown in FIG. 3, the semiconductor laser of this embodiment includes an n-type InP substrate 101, an n-type InP clad layer 102 on which a diffraction grating 107 is formed, an n-type InGaAsP lower light guide layer 103, an undoped active layer 104, a p-type InP clad layer 105, a p-type InCaAsP contact layer 106, a positive or p-side electrode 108, and a negative or n-side electrode 109. The grating 107 is formed at a boundary between the n-type clad layer 102 and the n-type light guide layer 103, and has a phase shift section 110. The pitch of the grating 107 is set such that its Bragg wavelength equals 1.550 μm. Layers and portions other than the active layer 104 have substantially the same structure as those of an ordinary phase-shifted DFB semiconductor laser.

Figure 2:
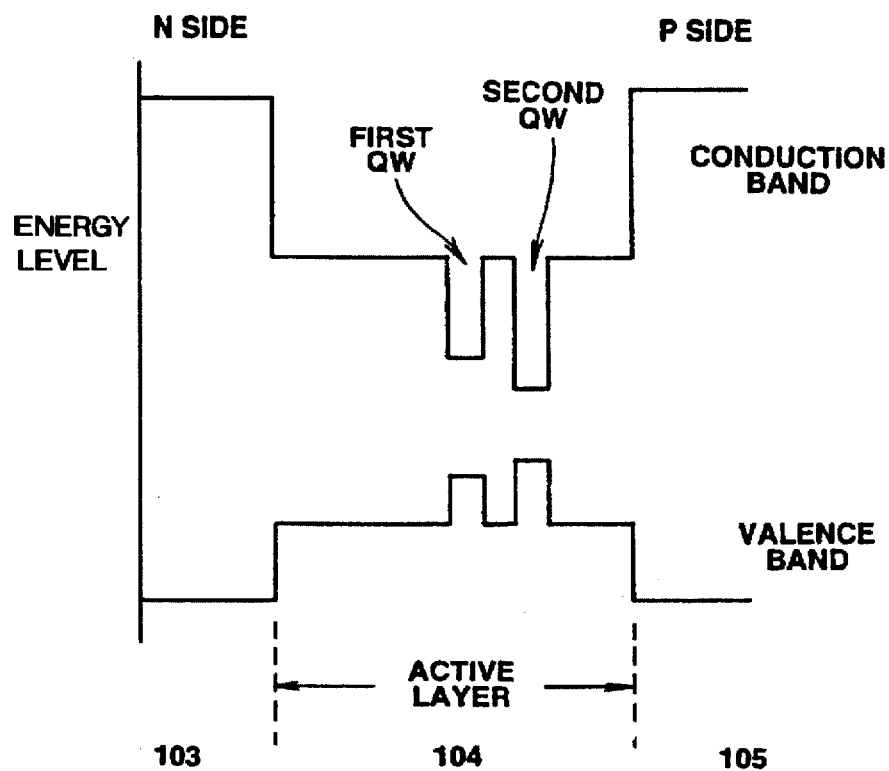
FIG. 2 is a diagram of the energy band structure of an active layer and layers adjacent thereto formed in a first embodiment of an oscillation polarization selective semiconductor laser according to the present invention.
Figure 6:
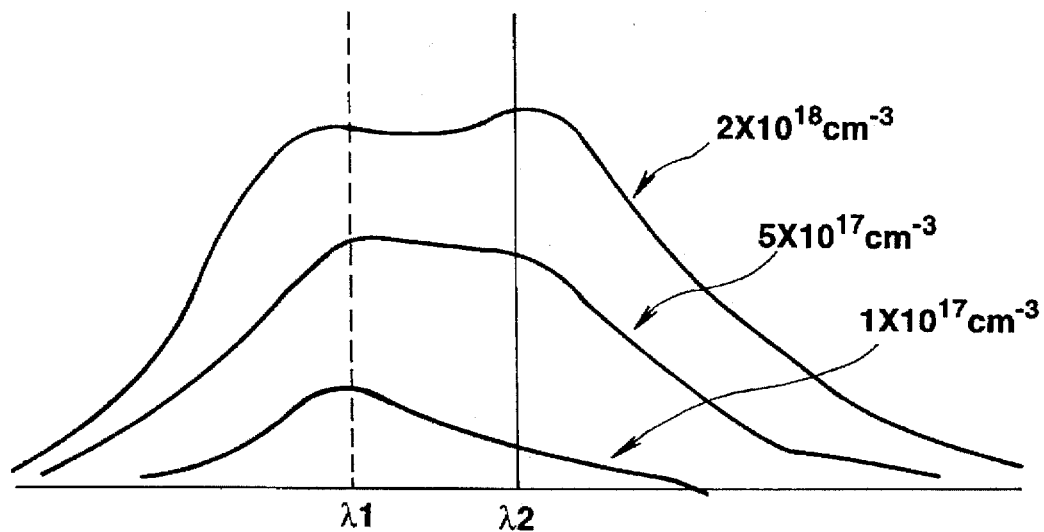
FIG. 6 is a graph illustrating a change in gain profiles or spectra while the amount of injected carriers is varied from $1 \times 10^{17}$ cm$^{-3}$ to $2 \times 10^{18}$ cm$^{-3}$.

The active layer 104 has the energy band structure as shown in FIG. 2. In the active layer 104, photoluminescence peak wavelengths of first and second quantum wells are set to 1.550 μm and 1.555 μm, respectively. That is, photoluminescence peak wavelength of first quantum well is made substantially equal to the Bragg wavelength of the diffraction grating 107. Its gain increases as the amount of injected carriers increases, similar to an ordinary semiconductor laser, but the dependency of the gain profile or gain spectrum on carrier density of this embodiment is quite large, different from gain of an ordinary bulk crystal or an ordinary quantum well structure. FIG. 6 illustrates a change in the gain profile dependent on the amount of injected carriers of this embodiment. Thus, the relationship of gains at Bragg wavelengths for TM and TE modes $\lambda_1$ and $\lambda_2$ can be controlled by the density of injected carriers.

On the other hand, it is well known that propagation modes to be excited in an ordinary semiconductor laser are TE and TM modes whose polarization directions are perpendicular to each other. In general, TE mode is likely due to polarization dependencies of gain, confinement coefficient and reflectance. In the laser, the oscillation condition is represented as:

$$\Gamma \cdot g = \Gamma \cdot \alpha + 1/2L \cdot \ln(1/R_1 \cdot 1/R_2)$$

where $\Gamma$ is the confinement coefficient of an active layer, g is the gain, $\alpha$ is the internal loss, $R_1$ and $R_2$ are effective reflectances with respect to opposite directions viewed from a point in the cavity and L is the cavity length, and those parameters respectively have polarization dependencies.

Figure 1:
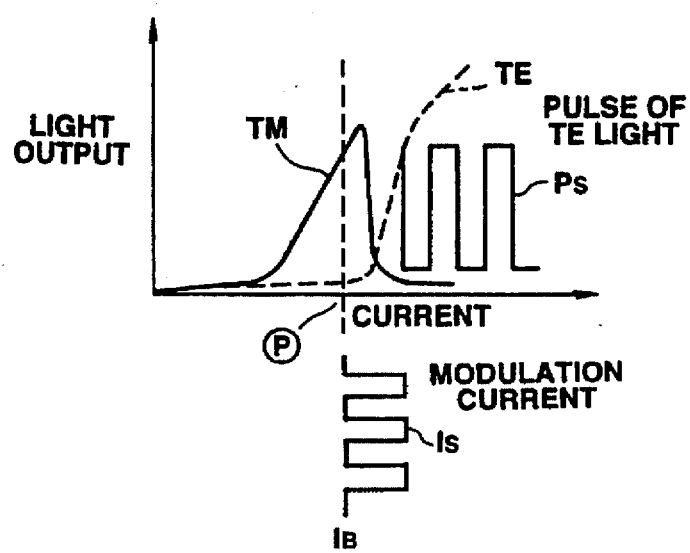
FIG. 1 is a graph for explaining a prior art semiconductor laser whose oscillation polarization can be switched between TE and TM modes.
Figure 7:
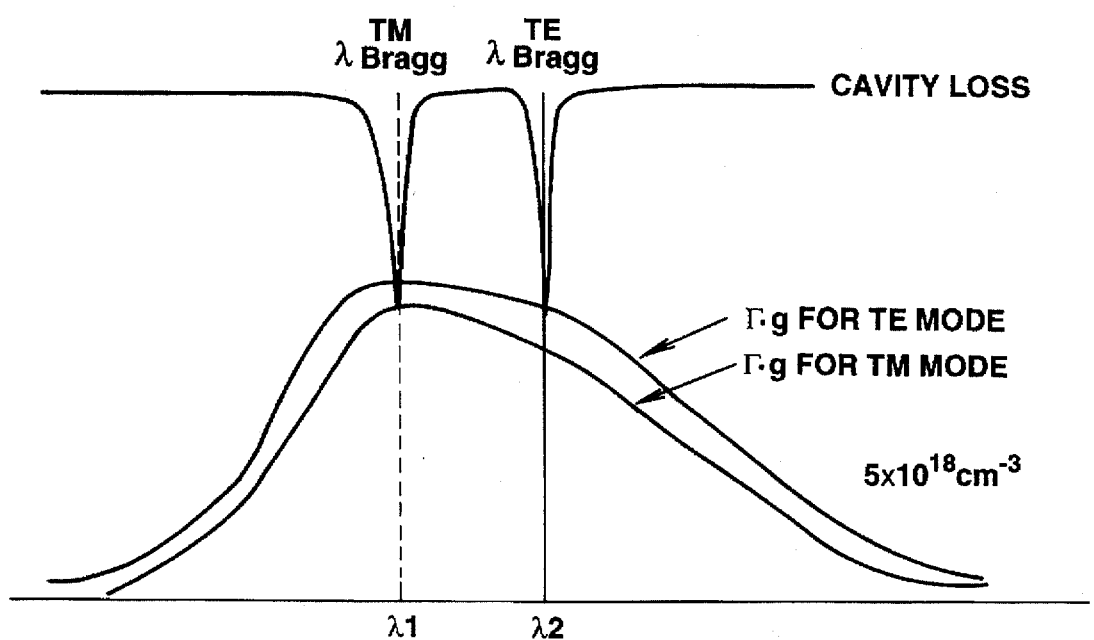
FIG. 7 is a graph illustrating profiles of $\Gamma \cdot g$ for TE and TM modes at the time when the amount of injected carriers is $5 \times 10^{18}$ cm$^{-3}$.
Figure 8:
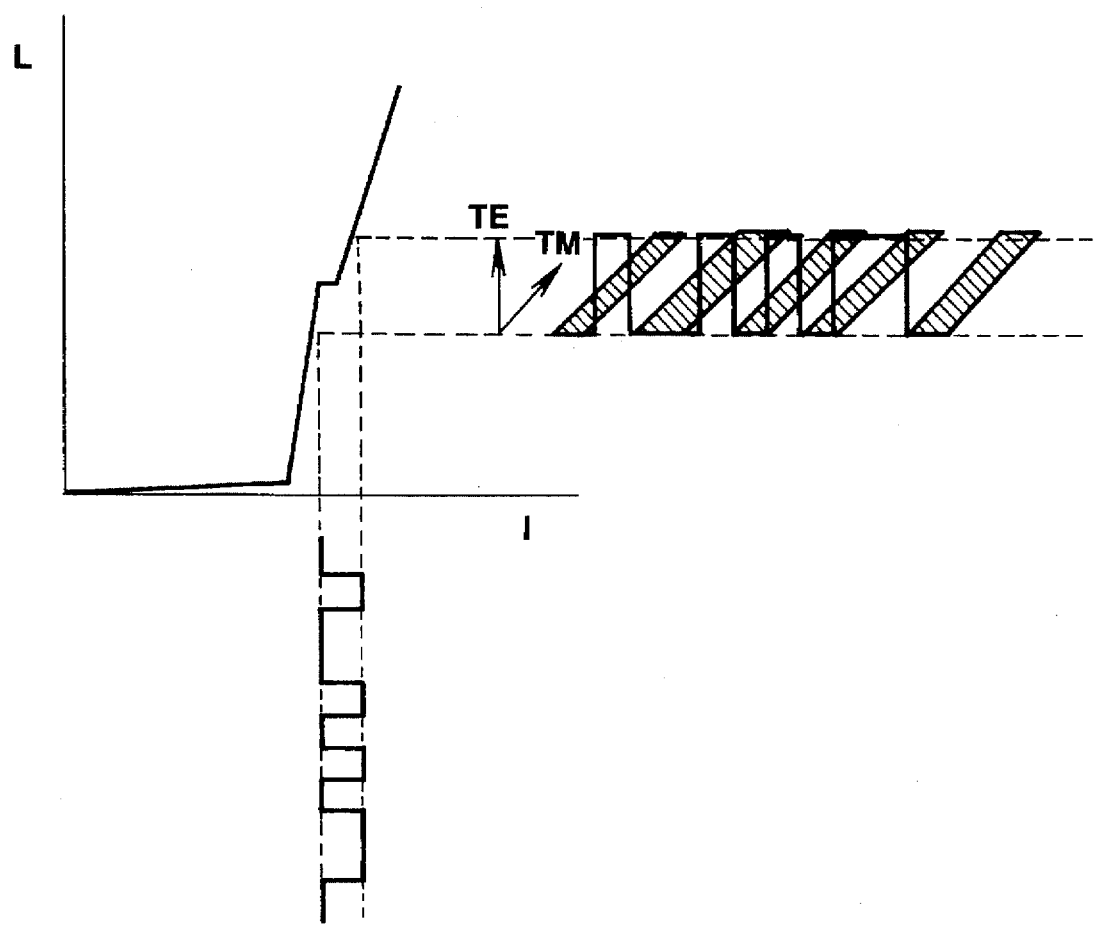
FIG. 8 is a graph illustrating modulation characteristics between intensity I of injection current and oscillation polarization (TE or TM) of output light L of a semiconductor laser of the present invention.

FIG. 7 illustrates profiles of threshold gain ($\Gamma \cdot g$) of this embodiment, considering polarization dependencies of confinement coefficients for TE and TM modes, at the time of a given carrier density or injected current. Bragg wavelengths $\lambda_1$ and $\lambda_2$ for TM and TE are split because of the polarization dependency of effective refractive index, and the gain profiles are set considering this difference between the Bragg wavelengths $\lambda_1$ and $\lambda_2$ for TM and TE modes. In FIG. 7, the polarization dependency of cavity loss is disregarded, and Bragg wavelength and gain peak for each polarization mode are caused to be equal to each other, for the sake of simplicification. The state illustrated in FIG. 7 is a competitive state in which oscillations in TE and TM modes are respectively about to take place in a competitive manner under the laser oscillation condition described above. FIG. 8 illustrates characteristics of the relationship between injected current and output light when a minute signal current is superimposed on a modulation bias point in the competitive state having the above amount of injected carriers. (see FIG. 7) Compared with a prior art shown in FIG. 1, it can be seen that the polarization switching can be effected between TE and TM modes by a minute current change or signal current in this embodiment. Therefore, total output light hardly varies during the polarization modulation operation and influences of chirping can hardly be observed.

Second Embodiment

In the first embodiment, it is necessary to control the gain profiles for TE and TM modes at the same time only by the widths of well layers and/or barrier layers, so the control is simple. Some problems, however, occur with achievement of high-performance and reproducibility. To improve the weak point of the first embodiment, the second embodiment makes use of the high polarization dependency or sensitivity of quantum well structure.

Generally, when a strain or stress is imparted to the quantum well structure, degeneracy in the valence band is solved and characteristics considerably different from those of no-strained structure appear. In an ordinary quantum well structure, gain for TE mode is slightly larger than that for TM mode, for example. This tendency is strengthened by imparting a compressive strain to the structure, while the gain for TM mode can be conversely larger than that for TE mode by imparting a tensile strain to the structure. Thus, the polarization sensitivity can be controlled. Further, a differential gain or a ratio between a change in injected carriers and a change in gain can also be increased by imparting a strain to the structure. Thus, it is known that low threshold and improvement of modulation frequency limit can be achieved by a strain quantum well structure.

The principle of design of the second embodiment is as follows:

(1) Layer thicknesses of asymmetric quantum wells are set such that DFB Bragg wavelengths for TE and TM modes respectively become substantially equal to ground energy levels of quantum wells at higher and lower energy sides under a non-strain condition. Since there is a possibility that bandgaps may vary after strain is imparted, cases may occur where the well layer thicknesses should be re-adjusted after the following steps (2) and (3) are conducted.

(2) A tensile strain is imparted to the quantum well layer at the higher energy side such that this quantum well layer greatly contributes to gain for TM mode.

(3) A compressive strain or no strain is imparted to the quantum well layer at the lower energy side such that this quantum well layer contributes highly to gain for TE mode.

Figure 9:
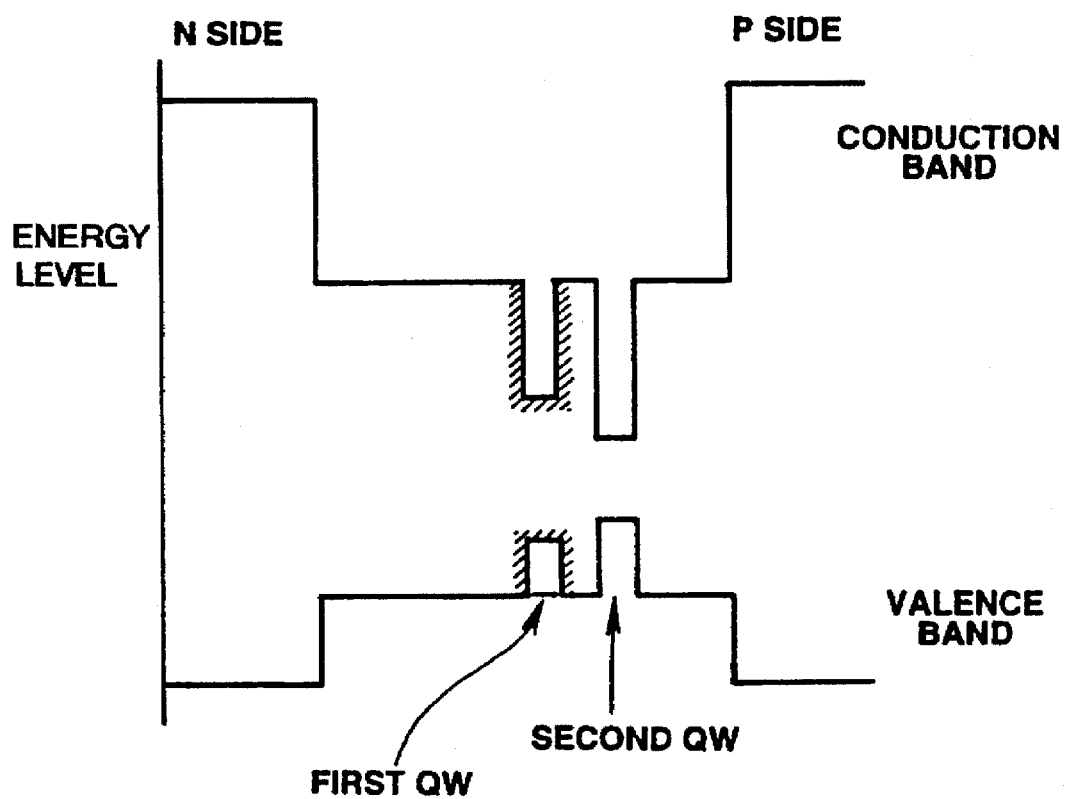
FIG. 9 is a diagram of the energy band structure of an active layer and layers adjacent thereto formed in the second embodiment.
Figure 10:
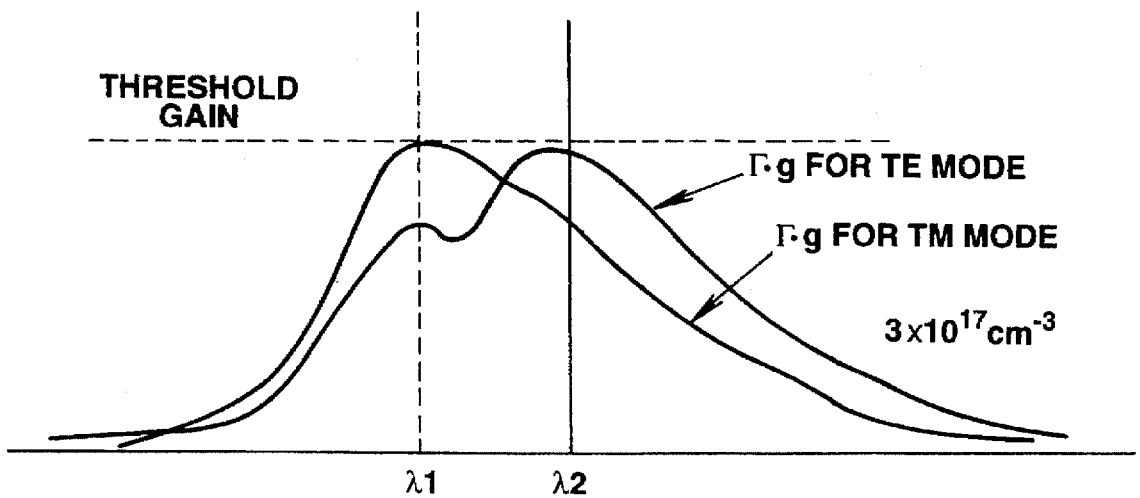
FIG. 10 is a graph illustrating profiles of $\Gamma \cdot g$ for TE and TM modes at the time when the amount of injected carriers is $3 \times 10^{17}$ cm$^{-3}$.

The energy band structure of a strain-imparted active layer of the second embodiment of the present invention is illustrated in FIG. 9. In FIG. 9, a strain of $-2.0\%$ or a tensile strain is imparted only to a first quantum well. (see the partly shaded well) No strain is imparted to a second well. FIG. 10 illustrates spectra of $\Gamma \cdot g$ for TE and TM modes at the time of a given carrier density or current injection. Compared with the first embodiment, the second embodiment has features as follows:

(1) A degree of freedom in design and reproducibility is increased since the gain profile is controlled by both the well layer thickness and the magnitude of strain. Specifically, the polarization modulation can be performed in a wide range of bias current points in this embodiment since the control of gain profile is conducted using two parameters, while in the first embodiment the range of bias curent points is narrow since the gain profile is greatly varied depending on the carrier density.

(2) The threshold carrier density is lowered in the second embodiment since the energy band structure in k space is varied in configuration, (3) The modulation efficiency is enhanced in the second embodiment since the effective mass is decreased and carriers become easy to move.

(4) The polarization dependency of gain spectrum can be increased and hence a difference in photoluminescence peak wavelength between TE and TM modes can be varied.

In this embodiment, tensile strain is imparted only to the first quantum well at the higher energy side, but it is possible to impart a compressive strain only to the second quantum well at the lower energy side, or to impart tensile and compressive strains to the quantum wells at higher and lower energy sides, respectively, or to impart tensile strains to the quantum wells at higher and lower energy sides, respectively. That is, various structures are possible according to the above-described design principle, depending on the object. Furthermore, since there may be a case where gain will be saturated in the case of two-layer quantum well structure, an asymmetric multiple strain quantum well structure, in which the above-discussed active layer is layered in a multi-form, may be used to solve the saturation of gain. The operation of this embodiment is substantially the same as the first embodiment.

Third Embodiment

Figure 4:
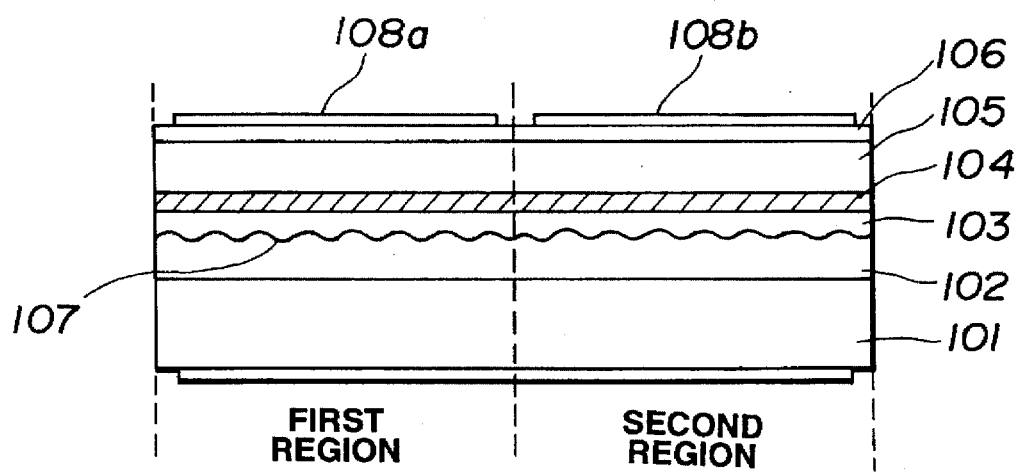
FIG. 4 is a longitudinal cross-sectional view showing the structure of a second embodiment of an oscillation polarization selective semiconductor laser according to the present invention.

In the case of a single-electrode structure, it may happen that it is difficult to perform the oscillation polarization modulation with a desired intensity of light output. As shown in FIG. 8, the position of a modulation bias current point is restricted in this case. This limitation can be moderated by using a two-electrode structure. FIG. 4 illustrates the structure of the third embodiment of an oscillation polarization selective semiconductor laser with two electrodes 108a and 108b. In FIG. 4, the same reference numerals as in FIG. 3 indicate the same elements or portions as those in FIG. 3.

Figure 11:
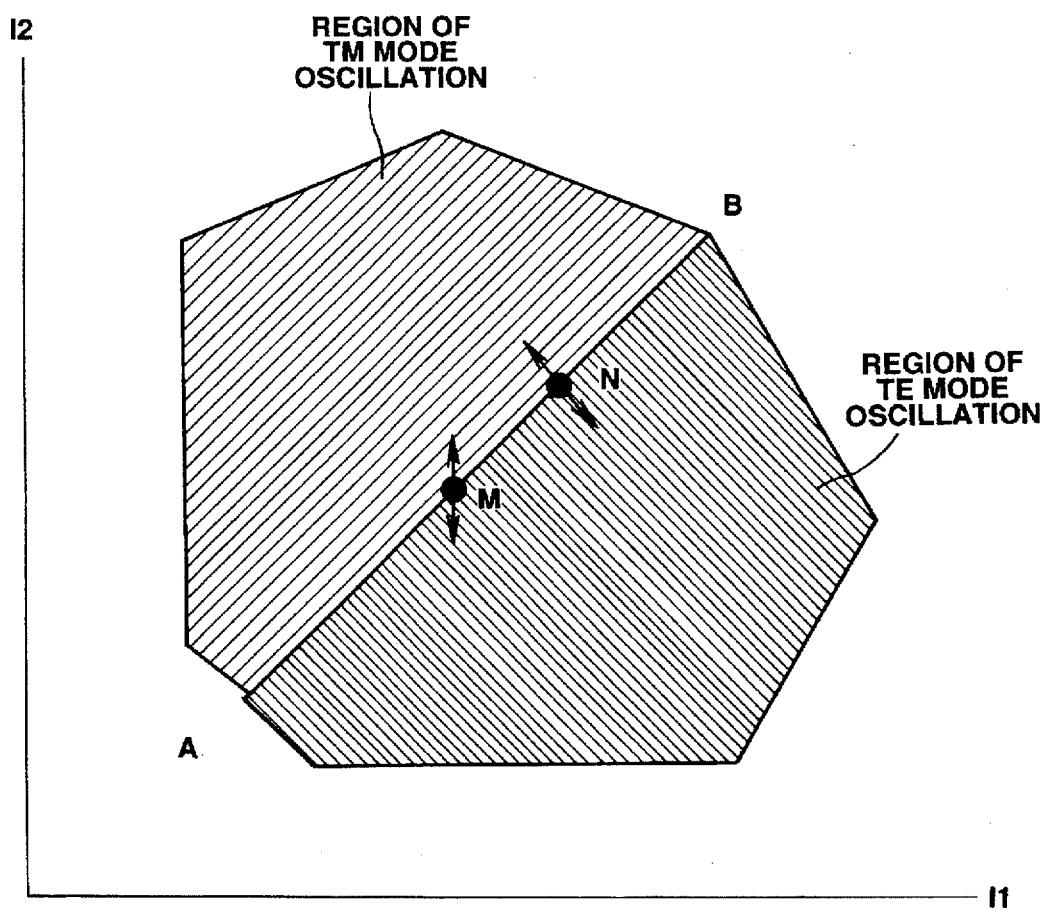
FIG. 11 is a graph illustrating the polarization mode mapping of a semiconductor laser of a two-electrode structure of the present invention.

First and second regions constitute a compound laser cavity, and the oscillation is performed in an oscillation mode common to those first and second regions. FIG. 11 illustrates the mapping example of oscillations in TE and TM modes when currents $I_1$ and $I_2$ respectively injected into the first and second regions are independently varied. A line A–B indicates a modulation bias current line on which TE and TM oscillations occur simultaneously or competitively, and the output increases as the condition moves from point A toward point B. In this state, when a modulation current is superimposed on at least one of the currents $I_1$ and $I_2$, the output light is switched between TE and TM modes. In FIG. 11, point M indicates a case when the modulation current is superimposed only on $I_2$, and point N indicates a case when modulation currents are respectively superimposed on the currents $I_1$ and $I_2$ with their phases shifted (e.g., in antiphase with each other). In the former case of point M, an electric circuit for this purpose is simple, while in the latter case of point N the modulation efficiency can be optimized. The operation of this embodiment is also substantially the same as the first embodiment.

Fourth Embodiment

Figure 5:
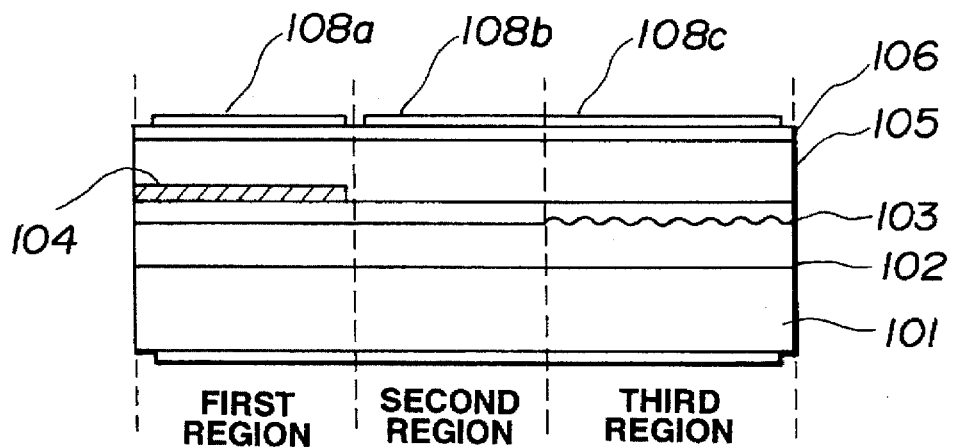
FIG. 5 is a longitudinal cross-sectional view showing the structure of a third embodiment of an oscillation polarization selective semiconductor laser according to the present invention.

The fourth embodiment is directed to a three-electrode tunable distributed Bragg reflector (DBR) semiconductor laser. FIG. 5 illustrates the cross-sectional structure of the fourth embodiment of an oscillation polarization selective semiconductor laser with three electrodes 108a, 108b and 108c which has a wavelength-changeable or tunable function. In FIG. 5, a first region has an active layer 104 of the structure described in the first or second embodiments, a second region is a phase adjusting or controlling region and a third region is a Bragg wavelength control region. The polarization modulation or switching can be performed while the oscillation wavelength is continuously changed over a range of 5 nm between 1.550 µm and 1.555 µm by controlling a current $I_3$ injected into the third region. In FIG. 5, the same reference numerals as in FIG. 3 indicate the same elements or portions as those in FIG. 3. The operation of this embodiment is also substantially the same as the first embodiment.

Fifth Embodiment

Figure 12:
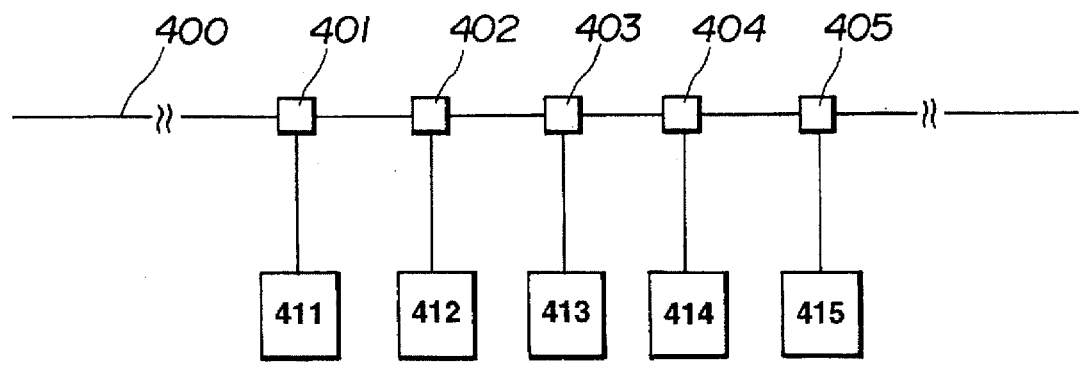
FIG. 12 is a block diagram of a bus-type optical communication network according to the present invention.
Figure 13:
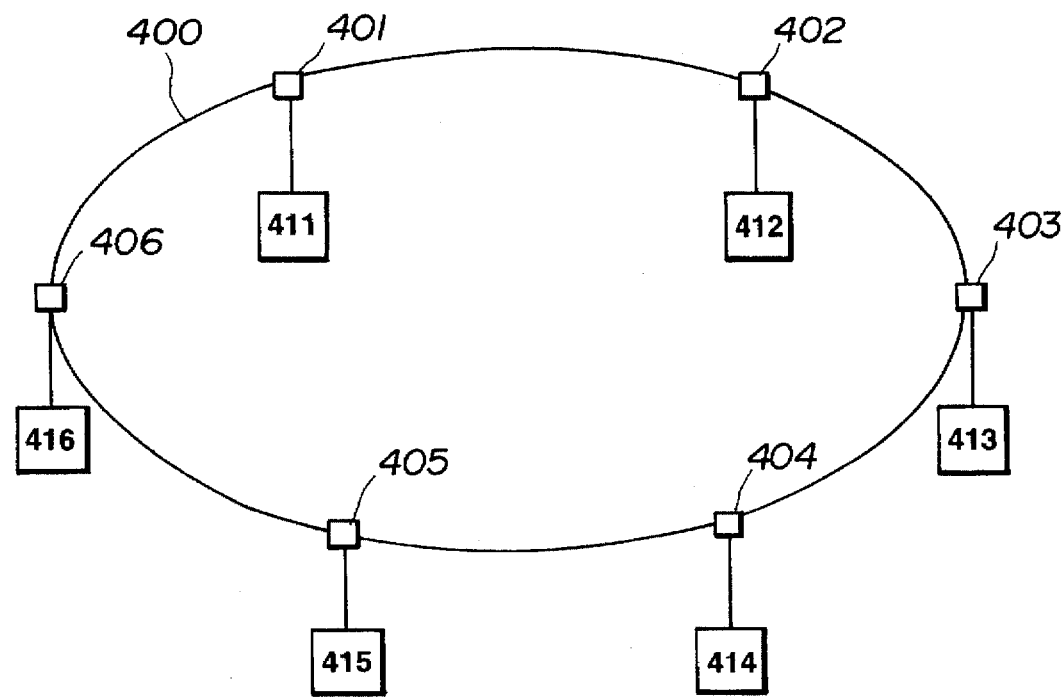
FIG. 13 is a block diagram of a loop or ring-type optical communication network according to the present invention.

The fifth embodiment will be described with reference to FIGS. 12 and 13. This embodiment is directed to an optical communication network using the above-discussed device and a polarizer.

The polarizer is disposed in front of the light emission end of the device described in one of the first to fourth embodiments. Thereby, only a predetermined polarized light can be taken out, and an amplitude-modulated signal can be transmitted over a transmission line. Networks illustrated in FIGS. 12 and 13 are respectively bus-type and loop-type networks, and devices of the present invention are respectively arranged in optical nodes 401–406. In FIGS. 12 and 13, reference numeral 400 is an optical bus line and reference numerals 411–416 are terminals.

Sixth Embodiment

In the fifth embodiment, if no polarizer is used, different polarized light waves can be transmitted simultaneously. As a result, a network can have multiple performances using devices of the present invention. In a wavelength or frequency division multiplexing system using a tunable laser and a tunable wavelength filter, for example, when the tunable filter is sensitive to the polarization state, devices of the present invention can be used with a very simple structure as a light source for polarization diversity. In this case, light received on a receiver side is divided into two portions and the divided portions are received by respective tunable filters. The polarization sensitive characteristics of the two filters are set substantially perpendicular to each other and signals are received by the two filters. In this construction, the different polarized light waves simultaneously transmitted from a transmitter side can be stably demodulated by appropriately processing outputs of the two filters, even if polarization directions of light signals fluctuate on the receiver side.

In the above-discussed embodiments, a device for a 1.5 µm band is used, but materials of other wavelength bands and other series can be used in the present invention.

According to the present invention, chirping can be lowered or eliminated, and high-speed modulation can be achieved with good performance. Further, a device can be fabricated with a very simple construction. Moreover, a device of the present invention can be applied to various communication networks, and high-performance systems can be realized.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. An oscillation polarization selective semiconductor laser for switching an oscillation polarization mode between two different polarization modes, said semiconductor laser comprising:

a distributed reflector; and an active layer, said active layer having at least two quantum well structures, each of which includes a quantum well and barriers, and a bandgap of a quantum well of one of said quantum well structures being different from a bandgap of a quantum well of the other of said quantum well structures such that a distribution of gain spectra generated in said active layer for said two different polarization modes induced in a layer structure of said laser is varied by varying a density of carriers injected into said active layer.

2. A semiconductor laser according to claim 1, wherein the layer structure of said laser includes at least a first clad layer, a light guide layer, said active layer and a second clad layer formed in this order, and said distributed reflector comprises a grating reflector formed in said light guide layer.

3. A semiconductor laser according to claim 1, wherein a strain perpendicular to a layering direction is imparted to at least one of said quantum well structures.

4. A semiconductor laser according to claim 3, wherein a strain perpendicular to the layering direction is imparted to said at least two quantum well structures.

5. A semiconductor laser according to claim 3, wherein a strain perpendicular to a layering direction is imparted to at least one of said barriers of said at least two of said quantum well structures.

6. A semiconductor laser according to claim 1, wherein said laser is divided into a plurality of regions in a resonance direction, electrodes are respectively formed on said regions and a level of injected carriers is varied by independently injecting carriers into said regions.

7. A semiconductor laser according to claim 1, wherein said reflector has a first Bragg wavelength for one of said two different polarization modes and a second Bragg wavelength for the other of said two different polarization modes, and said first and second Bragg wavelengths are set to values which are substantially equal to values corresponding to said bandgaps of said quantum wells.

8. A semiconductor laser according to claim 1, wherein said reflector has a first Bragg wavelength for one of said two different polarization modes and a second Bragg wavelength for the other of said two different polarization modes, and at least one of said first and second Bragg wavelengths is set to a value which is substantially equal to a a value corresponding to one of said bandgaps of said quantum wells.

9. A semiconductor laser according to claim 1, wherein said laser is constructed as a distributed feedback semiconductor laser.

10. A semiconductor laser according to claim 1, wherein said laser is constructed as a distributed Bragg reflector semiconductor laser.

11. A semiconductor laser according to claim 1, wherein said laser is constructed as a tunable semiconductor laser.

12. A semiconductor laser according to claim 3, wherein said strain is a tensile strain.

13. A semiconductor laser according to claim 3, wherein said strain is a compressive strain.

14. A semiconductor laser according to claim 3, wherein said strain is imparted to a quantum well of said at least one of said quantum well structures.

15. A semiconductor laser according to claim 14, wherein a tensile strain perpendicular to the layering direction is imparted to said quantum well which has a wider bandgap.

16. A semiconductor laser according to claim 14, wherein a compressive strain perpendicular to the layering direction is imparted to said quantum well which has a narrower bandgap.

17. A semiconductor laser according to claim 4, wherein a tensile strain perpendicular to the layering direction is imparted to said quantum well which has a wider bandgap, and a compressive strain perpendicular to the layering direction is imparted to said quantum well which has a narrower bandgap.

18. A semiconductor laser according to claim 1, wherein said two different polarization modes are a transverse electric mode and a transverse magnetic mode.

19. A semiconductor laser according to claim 18, wherein said reflector has a first Bragg wavelength for said transverse electric mode and a second Bragg wavelength for said transverse magnetic mode, and said first and second Bragg wavelengths are set to values which are substantially equal to values corresponding to said bandgaps of said quantum wells.

20. A semiconductor laser according to claim 19, wherein said first Bragg wavelength is set to a value which is substantially equal to a value corresponding to the bandgap of the quantum well which has a narrower bandgap, said second Bragg wavelength is set to a value which is substantially equal to a value corresponding to the bandgap of the quantum well which has a wider bandgap.

21. A semiconductor laser according to claim 1, wherein said reflector has a first Bragg wavelength for one of said two different polarization modes and a second Bragg wavelength for the other of said two different polarization modes.

22. A semiconductor laser according to claim 1, wherein at least two of said quantum well structures are stacked.

23. An optical communication system for transmitting a signal from a transmitter side to a receiver side over a transmission line, said communication system comprising:

an oscillation polarization selective semiconductor laser for switching an oscillation polarization mode between two different polarization modes, said semiconductor laser including a distributed reflector and an active layer, said active layer having at least two quantum well structures each of which includes a quantum well and barriers, and a bandgap of a quantum well of one of said quantum well structures being different from a bandgap of a quantum well of the other of said quantum well structures such that a distribution of gain spectra generated in said active layer for said two different polarization modes induced in a layer structure of said laser is varied by varying a density of carriers injected into said active layer; and a polarizer disposed in front of a light emission end surface of said semiconductor laser for selecting only a signal having a predetermined polarization mode.

24. A method for driving an oscillation polarization selective semiconductor laser comprising a distributed reflector and an active layer having at least two quantum well structures, each of which includes a quantum well and barriers and a band gap of a quantum well of one of said quantum well structures being different from a band gap of a quantum well of the other of said quantum well structures, and for switching an oscillation polarization mode between two different polarization modes, said method comprising steps of:

oscillating the laser, by injecting carriers into said active layer, in one of said two different polarization modes; and changing a density of the carriers to be injected into said active layer, wherein a distribution of gain spectra corresponding to said two different polarization modes is varied by changing said density of the carriers and the laser is oscillated in the other of said two different polarization modes.

* * * * *

UNITED STATES PATENT AND TRADEMARK OFFICE
CERTIFICATE OF CORRECTION

PATENT NO. : 5,699,373

DATED : December 16, 1997

INVENTOR(S): MAMORU UCHIDA ET AL.  Page 1 of 2

It is certified that error appears in the above-identified patent and that said Letters Patent is hereby corrected as shown below:

<u>ON TITLE PAGE, AT [56] REFERENCES CITED, FOREIGN PATENT DOCUMENTS</u>

"2144426   6/1987   Japan" should be deleted;
"2159781   6/1990   Japan" should be deleted;
"02159781" should read --2-159781--.

<u>COLUMN 1</u>

Line 6, "this" should read --This--;
Line 28, "of" (second occurrence) should read --of the--.

<u>COLUMN 2</u>

Line 57, "semicondcutor" should read --semiconductor--.

<u>COLUMN 4</u>

Line 26, "ImP" should read --InP--;
Line 30, "InCaAsP"" should read --InGaAsP--.

<u>COLUMN 5</u>

Line 11, "and" should read --and the--;
Line 13, "simplicification" should read --simplification--;
Line 21, "carriers. (see FIG. 7)" should read --carriers (see FIG. 7).--.

UNITED STATES PATENT AND TRADEMARK OFFICE
CERTIFICATE OF CORRECTION

PATENT NO. : 5,699,373

DATED : December 16, 1997

INVENTOR(S): MAMORU UCHIDA ET AL.

It is certified that error appears in the above-identified patent and that said Letters Patent is hereby corrected as shown below:

COLUMN 8

Line 20, "sprit" should read --spirit--.

COLUMN 9

Line 3, "a a" should read --a--.

Signed and Sealed this

Seventh Day of July, 1998

Attest:

BRUCE LEHMAN

*Attesting Officer*  *Commissioner of Patents and Trademarks*